United States Patent [19]

Yoshimura

[11] Patent Number: 4,717,843

[45] Date of Patent: Jan. 5, 1988

[54] PHASE CHANGING CIRCUIT

[75] Inventor: Tatsuro Yoshimura, Kawasaki, Japan

[73] Assignee: Fujitsu Limited, Kawasaki, Japan

[21] Appl. No.: 758,391

[22] Filed: Jul. 24, 1985

[30] Foreign Application Priority Data

Jul. 28, 1984 [JP] Japan ................................ 59-158208

[51] Int. Cl.⁴ ..................... H03K 19/086; H03K 5/13; H03K 5/159
[52] U.S. Cl. .................................. 307/455; 307/601; 307/603; 307/605; 307/595; 328/155; 328/55
[58] Field of Search ............... 307/455, 510, 511, 601, 307/603, 605, 595, 597; 328/155, 55

[56] References Cited

U.S. PATENT DOCUMENTS 4,435,654  3/1984  Koide ................................. 307/455

FOREIGN PATENT DOCUMENTS 53-82142  7/1978  Japan .
53-91443  7/1978  Japan .
0004231   1/1984  Japan ................................. 307/455

OTHER PUBLICATIONS

IBM Tech. Disclosure Bulletin, vol. 16, No. 11, 4/1974 "Variable Delay Pulse Circuits" by Marino.
PAL System, "Variable Delay Pulse Circuits" IBM Technical Disclosure Bulletin, vol. 16, No. 11, Apr. 1974, pp. 3498-3500.
IBM Technical Disclosure Bulletin, "Continuous Integrated Circuit Delay Line " vol. 21, No. 4, Sep. 1978, pp. 1582-1583.
"ECL Type Delay Circuit" English Abstract of Japanese Patent Publication 58-108824(A).
IBM Technical Disclosure Bulletin, "Encoded Variable Delay for Driver Circuits" vol. 22, No. 2, Jul. 1979, pp. 518-519.
European Search Report, Berlin, examiner: M. Arendt.

Primary Examiner—Stanley D. Miller
Assistant Examiner—Trong Quang Phan
Attorney, Agent, or Firm—Staas & Halsey

[57] ABSTRACT

A phase changing circuit in a logic circuit includes an ECL circuit which has a plurality of emitter output circuits. One emitter output circuit is used as the normal output. The other emitter output circuits are connected to additional capacitors. The emitter output circuits connected to the additional capacitors are also connected to an emitter output portion of separately provided control ECL circuits. An input control level of the control ECL circuit is changed to change the output level of the control ECL circuit. In accordance with whether the output level of the control ECL circuit is low or high, the additional capacitor affects or does not affect the normal output of the ECL circuit. When the capacitor affects to the normal output of the ECL circuit, the signal propagation from the input to the normal output is delayed.

6 Claims, 12 Drawing Figures

Fig. 8
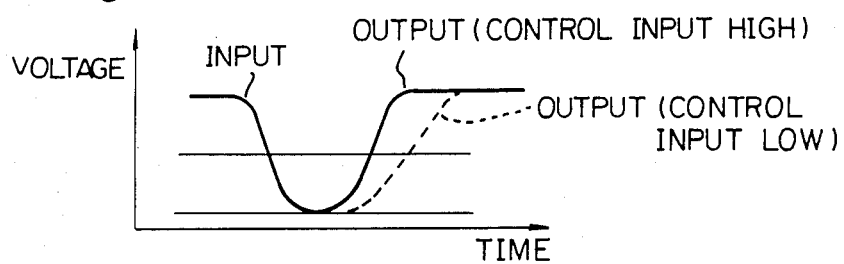
Fig. 9
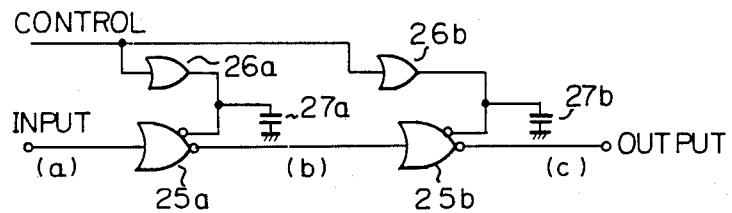
Fig. 10A
Fig. 10B
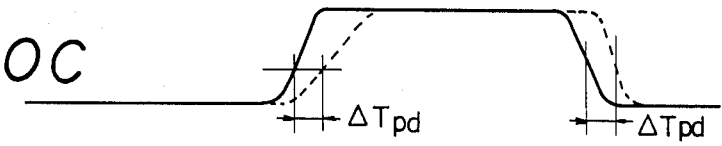
Fig. 10C

PHASE CHANGING CIRCUIT

BACKGROUND OF THE INVENTION

1. Field of the Invention

The present invention relates to a phase changing circuit in a logic circuit which includes an emitter-coupled logic (ECL) circuit having a plurality of emitter output circuits.

2. Description of the Related Art

In a clock synchronizing type data processor, clock signals having desired phases must be distributed to latches in the processor. Usually, the desired clock signals are obtained by making use, in a clock distribution circuit, of a delay line with delay value adjustable by taps or discrete wires (pair wires, fine wires, coaxial cables, etc.) with delay values adjustable by changing the length.

However, when data processors are formed by large-scale integrated circuits (LSI) of high densities, there is insufficient space for the delay lines or the discrete lines. Therefore, a circuit for adjusting (changing) the phase by a gate in an LSI is desired.

SUMMARY OF THE INVENTION

An object of the present invention is to provide a phase changing circuit, in a logic circuit, which can delay the phase of a transmission signal without occupying extensive space.

Another object of the present invention is to provide a phase changing circuit, in a logic circuit, which can adjust the phase of a transmission signal by using a gate of an LSI.

The above objects can be achieved by a phase changing circuit in a logic circuit including an ECL circuit which has a plurality of emitter-output circuits, including a first emitter output circuit in the ECL circuit used as a normal output portion and a second emitter output circuit in the ECL circuit connected by a first capacitor. The second emitter output circuit is connected to an emitter output circuit of a first control ECL circuit provided independently of the ECL circuit. An electric potential of the second emitter output circuit is turned on or off by changing a control input of the first control ECL circuit. The signal transmission from an input to the normal output portion of the ECL circuit is delayed when the emitter potential of the second emitter circuit is on.

BRIEF DESCRIPTION OF THE DRAWINGS

Further features and advantages of the present invention will be apparent from the ensuing description with reference to the accompanying drawings in which:

FIG. 8 is a time chart showing the operation of the phase changing circuit shown in FIG. 7;

FIG. 9 is a block diagram of a still further embodiment of a phase changing circuit according to the present invention; and FIGS. 10A, 10B, and 10C are waveforms showing the operation of the phase changing circuit shown in FIG. 9;

DESCRIPTION OF THE PREFERRED EMBODIMENTS

Figure 1:
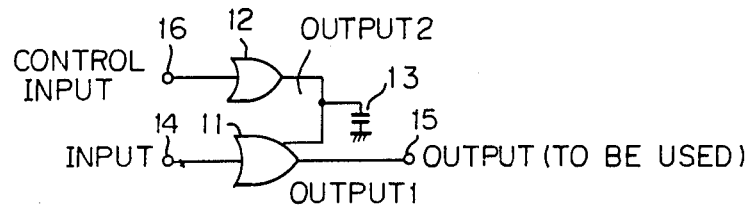
FIG. 1 is a block diagram of an embodiment of a phase changing circuit according to the present invention.

FIG. 1 is a block diagram of an embodiment of the phase changing circuit of the present invention. In FIG. 1, 11 designates an ECL gate having one input and two OR outputs, 12 a control gate having one input and one OR output, 13 an additional capacitor, 14 an input terminal, 15 an output terminal, and 16 a control input terminal.

Figure 2:
FIG. 2 is a logic symbol diagram of an ECL gate having one input and two OR outputs, shown in FIG. 1.
Figure 3:
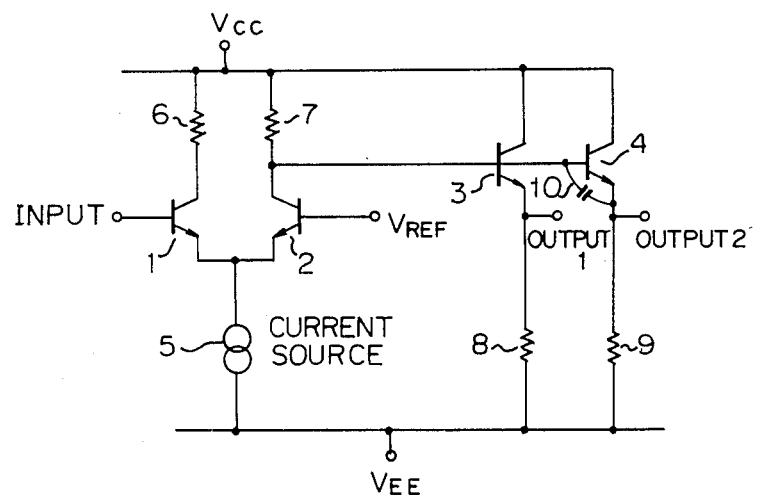
FIG. 3 is a circuit diagram of the internal construction of the ECL gate shown in FIG. 2.

FIG. 2 is a symbol diagram of an ECL gate having one input and two OR outputs shown in FIG. 1, and FIG. 3 is an example of an internal construction of the ECL gate shown in FIG. 2. In FIG. 3, 1 to 4 are transistors, 5 is a current source, 6 to 9 are resistors, 10 is a capacitor ($C_{BE}$) between a base and an emitter of the transistor 4, $V_{CC}$ and $V_{EE}$ are power sources, and $V_{REF}$ is a reference power source.

By using the construction shown in FIG. 1, the signal transmission delay time from the input to the output in question can be adjusted.

This is because the capacitance $C_{BE}$ between the base and the emitter of the transistor 4 in the ECL gate 11 increases and decreases substantially proportionally with the current flowing in the transistor 4. That is, when the level of the control input 16 is "High", the level of OUTPUT 2 of the ECL gate 11 is tied up at the "High" level by the output of the control gate 12 which is "emitter-dot" connected thereto and current does not flow in the transistor 4. Therefore, the value $C_{BE}$ of the transistor 4 is small.

Figure 4:
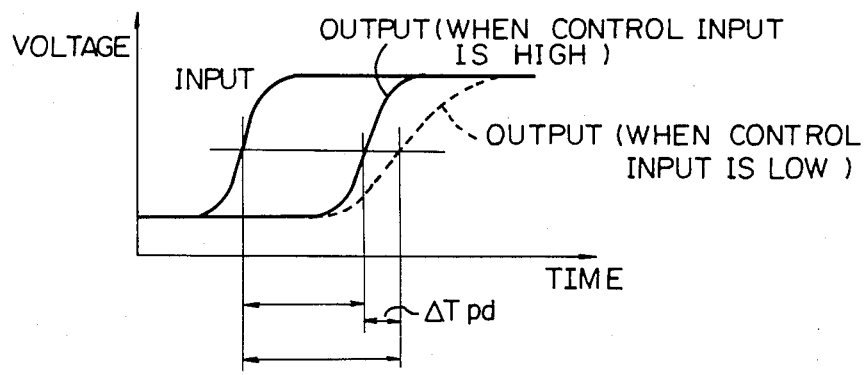
FIG. 4 is a time chart showing the operation of the phase changing circuit shown in FIG. 1.

On the other hand, when the level of the control input portion 16 is "Low", current flows in the transistor 4, and the value $C_{BE}$ of the transistor 4 is large. Therefore, the voltage change in the base terminal of the transistor 4 becomes slow by the increment of effective series capacitance of the $C_{BE}$ and the additional capacitor 13. And the voltage change in OUTPUT 1 at the output terminal 15 becomes slow too. As a result, the signal propagation delay time becomes large. The increment of this time ($\Delta Tpd$) can be controlled by changing the value of the capacitor 13. Further, this additional capacitor 13 can be made by the wiring pattern in the LSI and also controlled by changing the length or the width of the wiring pattern. FIG. 4 is a time chart of the operation of the embodiment shown in FIG. 1.

Figure 5:
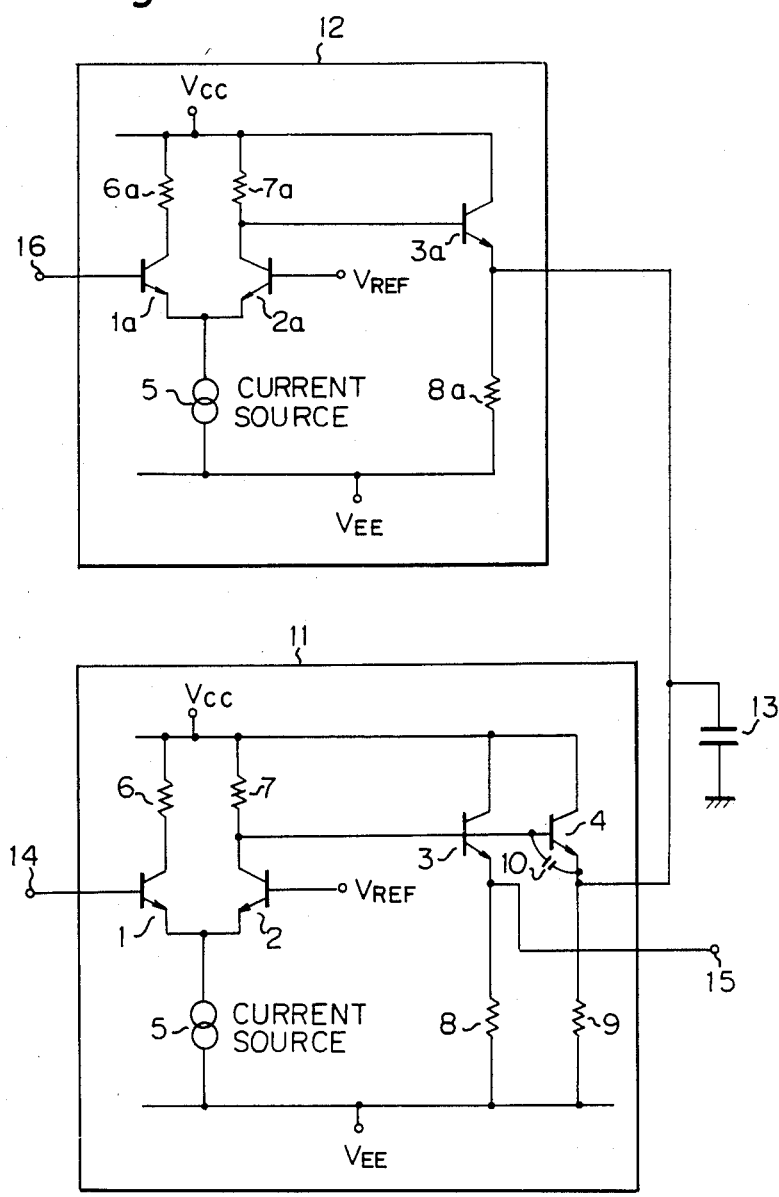
FIG. 5 is a detailed circuit diagram of the phase changing circuit shown in FIG. 1.

FIG. 5 is a detailed circuit diagram of the phase changing circuit shown in FIG. 1. The gate 12 in FIG. 5 has the same construction as the ECL gate 11 except that the output emitter circuit portion to be used as a normal output is not used. In the circuit shown in FIG. 5, when the control input terminal 16 receives a signal having a low level compared with the reference voltage $V_{REF}$, the current flows via the transistor $2a$, and the collector of the transistor $2a$ becomes low level, so that the emitter of the transistor $3a$ is placed at the low level.

However, in FIG. 5, if the base of the transistor 3a is connected from the collector of the transistor 1a, the emitter of the transistor 3a can be placed at the low level when the control input portion is the high level. Of course, such a modification can be applied to the present invention.

Figure 6:
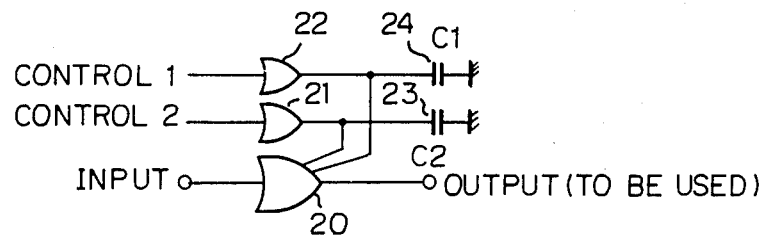
FIG. 6 is a block diagram of another embodiment of a phase changing circuit according to the present invention.

In the embodiment shown in FIG. 1, the gate in question has two OR outputs. However, as shown in FIG. 6, a gate having three OR outputs may be used. In FIG. 6, 20 is a gate having one input and three OR outputs, 21 and 22 are control gates having one input and one OR output each, and 23 and 24 are additional capacitors ($C_1$, $C_2$).

In the example shown in FIG. 6, the delay time can be controlled by the control signals 1 and 2 when the values of $C_1$, $C_2$ are changed.

Figure 7:
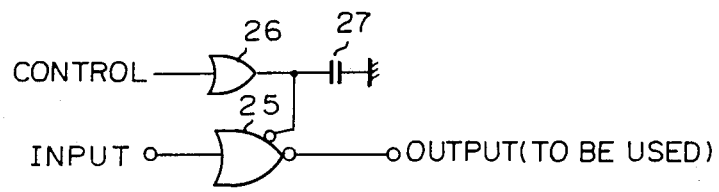
FIG. 7 is a block diagram of a further embodiment of a phase changing circuit according to the present invention.

Further, as shown in FIG. 7, a similar effect can be obtained when a gate having a NOR output is used as the gate in question.

In FIG. 7, 25 is an ECL gate having one input and two NOR outputs, 26 is a control gate having one input and one OR output, and 27 is an additional capacitor. FIG. 8 is a time chart of the embodiment shown in FIG. 7.

FIG. 9 shows two of the circuits illustrated in FIG. 7 connected in series to delay the input pulse. FIGS. 10A, 10B, and 10C show waveforms at the portions (a), (b), and (c) of the circuit in FIG. 9. FIG. 10A is a waveform of the input pulse. FIG. 10B is a waveform of the output of the gate 25a, that is, the input of the gate 25b. In FIG. 10B, the rising portion of the pulse is delayed by $\Delta Tpd$ when the control input level is low. FIG. 10C is a waveform of the output pulse of the gate 25b. In FIG. 10C, the falling portion of the output pulse is delayed by $\Delta Tpd$.

As mentioned above, according to the present invention, the phase of a signal in the internal circuit of an LSI, etc. can be easily adjusted and the advantages of miniaturization of the apparatus, etc. can be obtained.

I claim:

1. A phase changing circuit in a logic circuit, said phase changing circuit, connectable to a fixed voltage, receiving input and control signals and outputting an output signal, comprising:
an output ECL circuit operatively conencted to receive the input signal, comprising:
 a buffer circuit, operatively connected to receive the input signal, for generating an internal signal in dependence upon the input signal;
 a first emitter output circuit, having an input operatively connected to said buffer circuit, for outputting the output signal in dependence upon the internal signal; and
 a second emitter output circuit having an input operatively connected to said buffer circuit and having an output producing a controlled signal;
a first capacitor having a first end operatively connected to the output of said second emitter output circuit and a second end connectable to said fixed voltage; and
a first control ECL circuit operatively connected to the first end of said first capacitor and to receive a first control signal, the controlled signal output by said second emitter output circuit being held at a first output level when the first control signal has a first control level and having either the first output level or a second output level in dependence upon the internal signal when the first control signal has a second control level, changes of the output signal in response to changes in the input signal being delayed when the control signal has the second control level.

2. A phase changing circuit according to claim 1, further comprising:
second to n'th capacitors; and
second to n'th control ECL circuits operatively connected to said second to n'th capacitors and to receive second to n'th control signals, respectively, and
wherein said output ECL circuit further comprises third to n+1'th emitter output circuits, having inputs operatively connected to said first emitter output circuit and outputs respectively connected to said second to n'th capacitors, the input signal being subjected to a signal transmission delay time in said output ECL circuit in dependence upon the first to n'th control signals.

3. A phase changing circuit according to claim 2, wherein said first to n'th capacitors are formed by wiring patterns, each having a length and a width, said first to n'th capacitors each having a capacitance determined by the length and width of the wiring pattern.

4. A phase changing circuit according to claim 1, wherein said first capacitor is formed by a wiring pattern having a length and a width, said first capacitor having a capacitance determined by the length and width of the wiring pattern.

5. An emitter-coupled logic circuit, operatively connected to a power supply, providing a variable delay to an input signal, comprising:
an input circuit, operatively connected to receive the input signal, for producing an intermediate signal;
a first emitter-coupled logic output circuit having a control terminal operatively connected to receive the intermediate signal and an output terminal providing an output signal changing in dependence upon the input signal with a delay;
a second emitter-coupled logic output circuit having a control terminal connected to the control terminal of said first emitter-coupled logic output circuit and having an output terminal;
a control gate, operatively connected to receive an input control signal, having an output terminal for outputting an output control signal; and
a capacitor, having one end operatively connected to the output terminals of said second emitter-coupled logic output circuit and the control gate and having a second end operatively connected to the power supply, the delay provided by the first emitter-coupled logic output circuit varying in dependence upon the control signal.

6. A circuit as recited in claim 5, wherein said first and second emitter-coupled logic output circuits comprise first and second NPN transistors, respectively, having bases connected together, collectors connected to the power supply and emitters forming the output terminals thereof.

* * * * *